US006498717B2

(12) United States Patent
Matthews (10) Patent No.: US 6,498,717 B2
(45) Date of Patent: Dec. 24, 2002

(54) SURFACE MOUNTED PANEL ADAPTER FOR A SOCKET MOUNTED ELECTRICITY METER

(76) Inventor: Christopher Howard Matthews, 5660 Broxton Cir., Norcross, GA (US) 30092-2015

( * ) Notice: Subject to any disclaimer, the term of this patent is extended or adjusted under 35 U.S.C. 154(b) by 0 days.

(21) Appl. No.: 09/901,478

(22) Filed: Jul. 9, 2001

(65) Prior Publication Data

US 2002/0030964 A1 Mar. 14, 2002

Related U.S. Application Data

(63) Continuation-in-part of application No. 09/630,131, filed on Aug. 1, 2000, now Pat. No. 6,259,596, which is a continuation-in-part of application No. 09/238,392, filed on Jan. 27, 1999, now Pat. No. 6,104,601.
(60) Provisional application No. 60/072,828, filed on Jan. 28, 1998.

(51) Int. Cl.[7] .................................................. H02B 1/00
(52) U.S. Cl. ................... 361/665; 361/664; 361/666; 361/668; 439/517; 174/52.1; 324/156
(58) Field of Search ................... 361/664, 666, 361/665, 668, 659, 667, 671, 672; 439/517; 174/52.1; 324/156

(56) References Cited

U.S. PATENT DOCUMENTS

| 4,314,738 | A | * | 2/1982 | Davis et al. ................. 439/517 |
| 4,404,521 | A | * | 9/1983 | Fennell ........................ 361/664 |
| 5,134,544 | A | * | 7/1992 | Howell ........................ 361/668 |
| 5,385,486 | A | * | 1/1995 | Robinson et al. ........... 439/517 |
| 5,944,555 | A | * | 8/1999 | Robinson et al. ........... 439/517 |
| 6,059,605 | A | * | 5/2000 | Robinson et al. ........... 439/517 |
| 6,074,246 | A | * | 6/2000 | Seefeldt et al. ............. 361/668 |

* cited by examiner

Primary Examiner—Boris Chervinsky
(74) Attorney, Agent, or Firm—Sanford J. Asman (57) ABSTRACT

A surface mounted panel adapter for a socket mounted electricity meter allows a socket mounted electricity meter to be installed on a switchboard. The surface mounted panel adapter is designed to attach to the back of a switchboard, and to expose a meter socket which is mounted on the front wall of the surface mounted panel adapter and which is exposed through the front wall of the switchboard. A standard socket mounted electricity meter can be mounted in the meter socket through the opening in the switchboard. Electrical connections to the meter socket are made using at least one terminal strip mounted on the rear wall of the panel adapter, and readily accessible to an installer who is behind the switchboard panel.

6 Claims, 11 Drawing Sheets

FIG. 18

SURFACE MOUNTED PANEL ADAPTER FOR A SOCKET MOUNTED ELECTRICITY METER

CROSS-REFERENCE TO RELATED APPLICATIONS

The present application is a continuation-in-part of U.S. patent application Ser. No. 09/630,131, filed Aug. 1, 2000, now U.S. Pat. No. 6,259,596 entitled SURFACE MOUNTED PANEL ADAPTER FOR A SOCKET MOUNTED ELECTRICITY METER, issued Jul. 10, 2001, which was a continuation-in-part of U.S. patent application Ser. No. 09/238,392, filed Jan. 27, 1999, now U.S. Pat. No. 6,104,601 entitled PANEL ADAPTER FOR A SOCKET MOUNTED ELECTRICITY METER, issued Aug. 15, 2000, which was based upon provisional patent application Ser. No. 60/072,828 entitled PANEL ADAPTER FOR A SOCKET MOUNTED ELECTRICITY METER, filed Jan. 28, 1998.

BACKGROUND OF THE INVENTION

The present invention relates to electricity meters. In particular, the present invention relates to an adapter which can be used to enable a standard socket mounted electricity meter to be used as a small case switchboard meter or as a large case switchboard meter.

As is known by those skilled in the electrical metering arts, socket mounted meters are used in numerous locations. As used herein, the term "socket mounted meter" is intended to mean an electricity meter which is intended to be mounted in a base. Common examples of socket mounted meters are those electricity revenue meters which are found on the sides of homes and commercial buildings and in substations.

As used herein, the term "switchboard" is used to refer to a relatively large, flat panel which has metering equipment mounted thereon, or more typically, therethrough, such that the metering equipment may be viewed from the front. However, the electrical connections to the panel mounted meters are made at the rear of the switchboard panel.

Due to the nature of a switchboard, in which the intent is to maintain a relatively flat frontal appearance, a class of metering equipment, called small case meters have been designed to mount either on, or through, switchboards in order to be able to have only their display portions, or a relatively small portion of the meter, exposed on the front side of the meter.

Another factor which is present in typical small case meters, of the type intended for use on a switchboard, is that they are generally adapted to be mounted from the front, and they are thereafter wired from the rear, enabling a single person to be able to both mount and wire them.

Heretofore the different physical configuration of a socket meter, in which the meter is significantly longer than what would be desired to extend through the panel prevented standard meters from being used, also, as switchboard meters. The present invention provides an apparatus which allows a standard socket meter to be used as a switchboard meter, so it is not necessary to store both socket meters and switchboard meters. A socket meter used with the present invention, as a switchboard meter, can readily be removed and used as a standard socket meter.

DETAILED DESCRIPTION OF THE EXEMPLARY EMBODIMENTS

Figure 1:
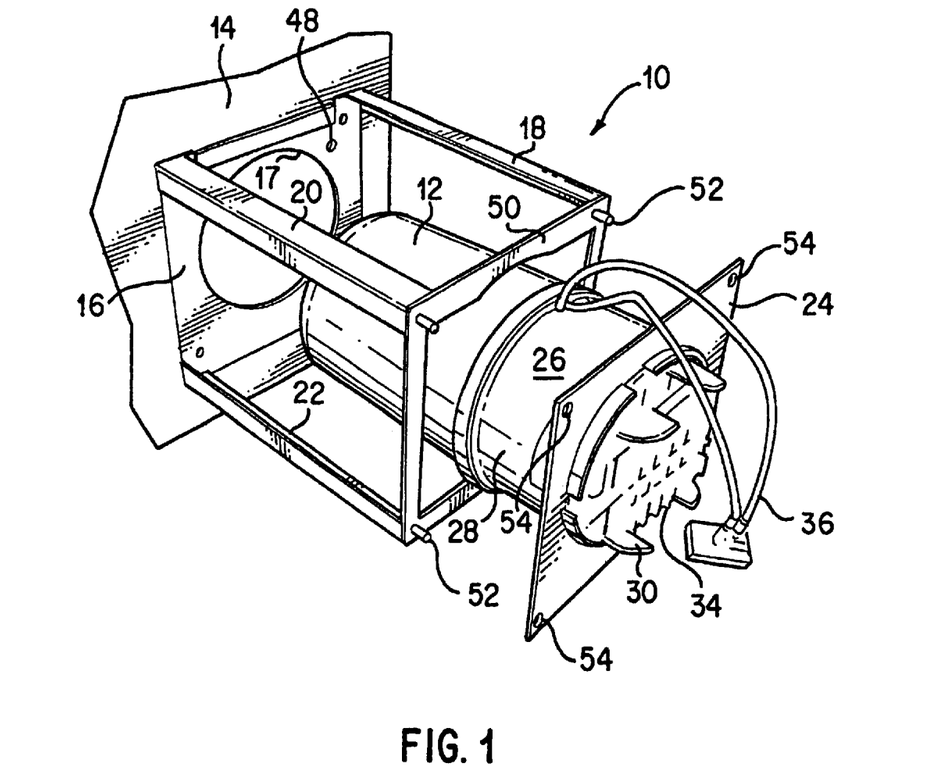
FIG. 1 illustrates a perspective view, showing the present invention, and illustrating how a socket meter is mounted in it.
Figure 3:
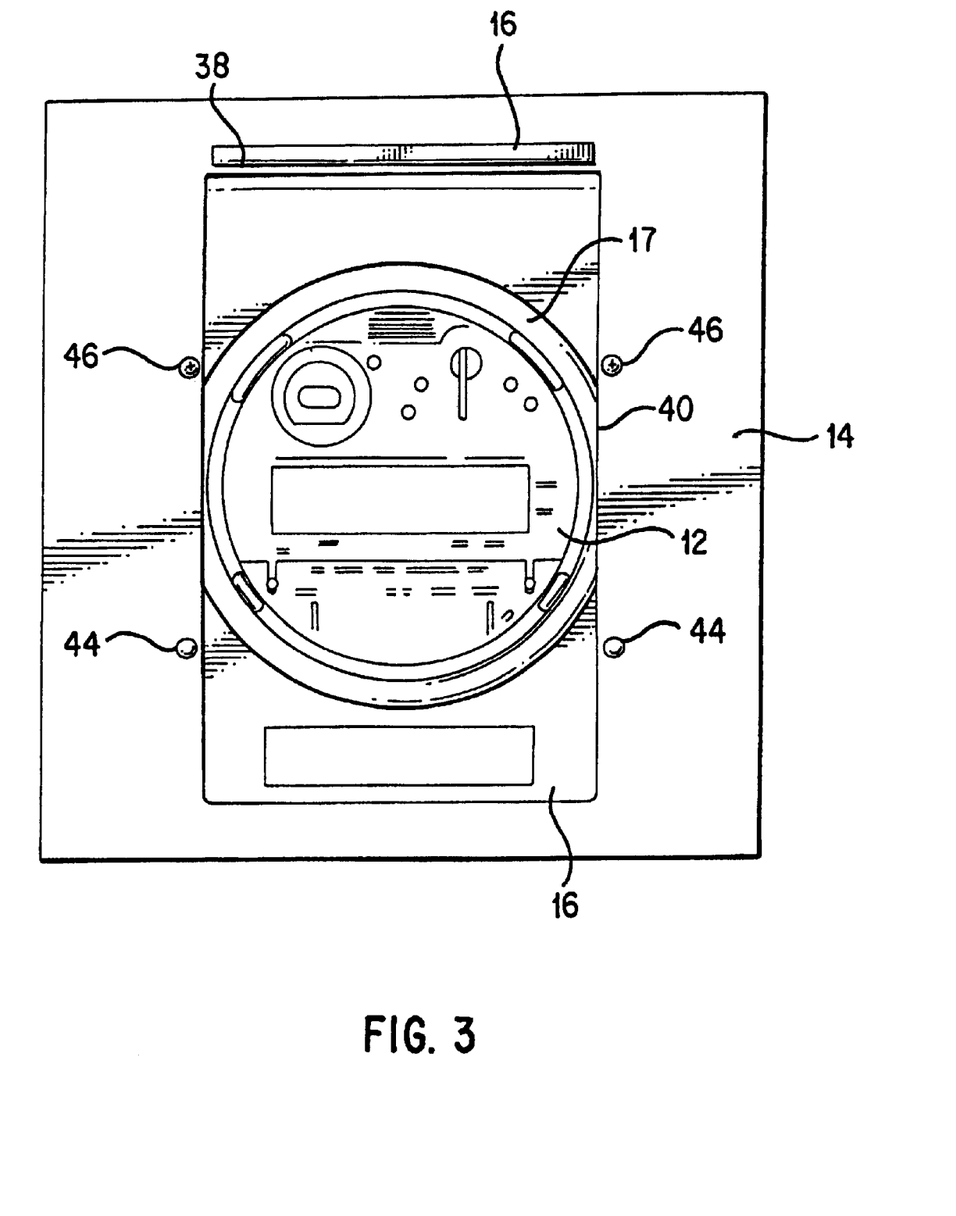
FIG. 3 illustrates a front view of a switchboard showing how a socket meter appears when viewed from the front of the switchboard when the present invention is used to mount it.

Referring first to FIG. 1, a first embodiment 10 of the panel adapter of the present invention is shown. As shown, the panel adapter 10 allows a standard socket mounted meter 12 to be mounted in a switchboard 14. The panel adapter 10 is comprised of a front wall 16 having an opening 17, formed therein. The face 19 of the meter 12 will be visible through the opening 17, when the meter 12 is installed in the adapter 10, as shown in FIG. 3. As shown in FIG. 3, the face 19 of the meter 12 will be substantially flush with the front of the switchboard 14, following installation. As used herein, the term "substantially flush" is intended to mean that the face 19 of the meter 12 can protrude somewhat through the switchboard 14, or that it can be coplanar with the front of the switchboard 14, or that it can be somewhat behind the front of the switchboard 14.

Figure 2:
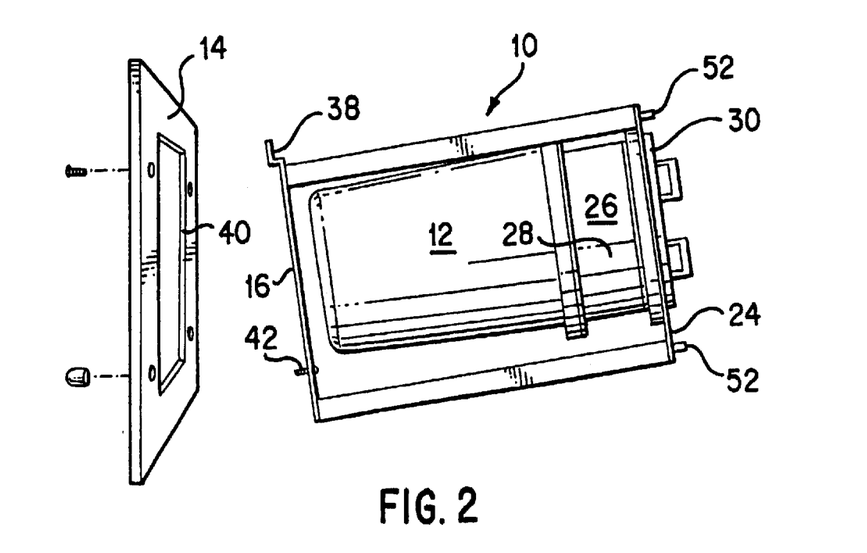
FIG. 2 illustrates the manner of mounting the present invention, together with a socket mounted therein, in a switchboard.

With continued reference to FIGS. 1 and 2, the front wall 16 has four legs attached to it, of which three of the legs 18, 20, 22, are visible in FIG. 1. The adapter 10 further includes a rear wall 24, on which a meter socket 26 is mounted. As shown in FIG. 1, the meter socket 26 has a socket portion 28, to which the meter 12 is attached, and a connection portion 30, which extends to the rear of the rear wall 24. At the rear of the connection portion 30, there are terminal blocks 34 used to make electrical connections to the meter 12. The meter socket 26, in the preferred embodiment of the invention, is wired with an input/output cable 36 which may be used to provide pulse outputs from the meter 12 to a data recorder or other device. Alternatively, the input/output cable 36 may be used for serial communications between the meter 12 and an external device (not shown).

With continued reference to FIGS. 1–3, the front wall 16 optionally includes an elongated hook 38, which is narrower than the width of the front wall 16, and which is offset from the remainder of the front wall 16, so that the hook 38 can extend through the cut-out opening 40 in the switchboard 14 (See FIG. 3).

The panel adapter 10 of the first embodiment of the invention is easily used by a single installer, even though installation must be accomplished from both sides of the switchboard 14. From the rear of the switchboard 14, the hook 38 on the front wall 16 of the adapter10 is placed through the cut-out 40. This can be accomplished with the meter 12 installed, as shown in FIG. 2, or with the rear wall 24 removed from the adapter 10. As shown in FIG. 2, in the preferred embodiment of the invention, there are a pair of threaded lugs 42, which are placed through openings 44 in the switchboard 14. The installer then goes to the front of the switchboard (See FIG. 3) where he installs threaded nuts 44 on the lugs 42. Also, screws 46 are inserted though additional openings and screwed into threaded openings 48 (which may be trapped nuts, as shown in FIG. 1) on the front wall 16.

Next, the installer returns to the rear of the switchboard 14, where he installs the rear wall 24 (with the meter 12 already in the socket 26) to the rear frame 50, using threaded lugs 52, which extend through openings 54 on the rear wall 24, as shown in FIG. 1. Wing nuts or other nuts (not shown) are used to install the rear wall 24 to the rear frame of the adapter 10.

The adapter 10 of the present invention can have legs which are of different lengths to adapt meters 12 of different lengths. Hole patterns, openings, and the length of the hook 38 are based upon the openings and hole patterns in standard switchboards, but they may be varied, as needed. The adapter 10 is preferably made of powder coated steel, having a typical thickness of about ⅛ inch, although other materials can be used without departing from the present invention.

Figure 4:
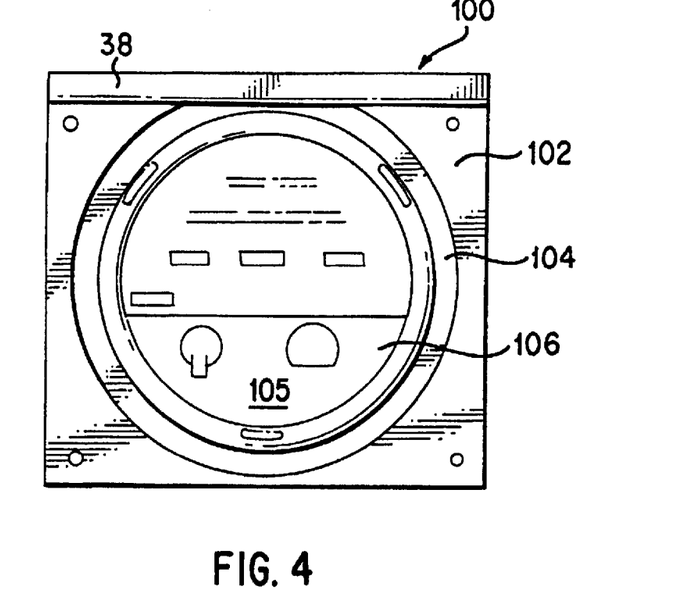
FIG. 4 illustrates a front view of a second embodiment of the present invention which allows a socket meter to be mounted from the front of the panel.

Referring now to FIG. 4, a front view of an alternative embodiment 100 of the invention is shown. In this embodiment 100, the front wall 102 of the adapter 100 has an opening 104 formed therethrough which preferably has a diameter of approximately 1.5 inches larger than the diameter of the face 105 of the meter 106 which is installed using the adapter 100. This larger opening 104 (relative to the opening 17 in the embodiment 10 shown in FIGS. 1–3) enables the user to remove the socket meter 106 from the front (i.e., through the opening 104), as well as from the rear of the switchboard 14, as is done when using the adapter 10 of the first embodiment (See FIG. 1) illustrated in FIGS. 1–3. In the adapter 10 of the first embodiment the socket meter 12 can be installed and removed only from the rear of the switchboard 14, by removing the rear wall 24 (See FIG. 1).

In view of the fact that the embodiment 100 permits the socket meter 106 to be mounted from the front of the switchboard, rather than from the rear of the switchboard, it is not necessary, when using the embodiment 100 to mount the meter 106 and its associated socket 108 to the rear wall 110 of the adapter 100 prior to mounting the adapter 100 to the rear of the switchboard, as it was necessary to mount the meter 12 along with its associated socket 26 to the rear wall 24 of the adapter 10 of the first embodiment (See FIGS. 1 and 2) before mounting the adapter 10 of the first embodiment to the rear of the switchboard. Instead, the socket 108 is mounted to the rear wall 110 of this embodiment of the adapter 100 with the meter 106 either installed or not installed. If the meter 106 has not been installed when the adapter 100 is mounted to the switchboard, then the meter 106 may be installed through the opening 104 in the front 102 of the adapter 100. Of course, even if the meter 106 is installed from the rear of the switchboard, this embodiment of the adapter 100 permits the meter 106 to be removed and/or replaced from the front of the switchboard, whereas the adapter 10 of the first embodiment requires removal of the rear wall 24 each time a meter 12 is installed or removed.

Figure 6:
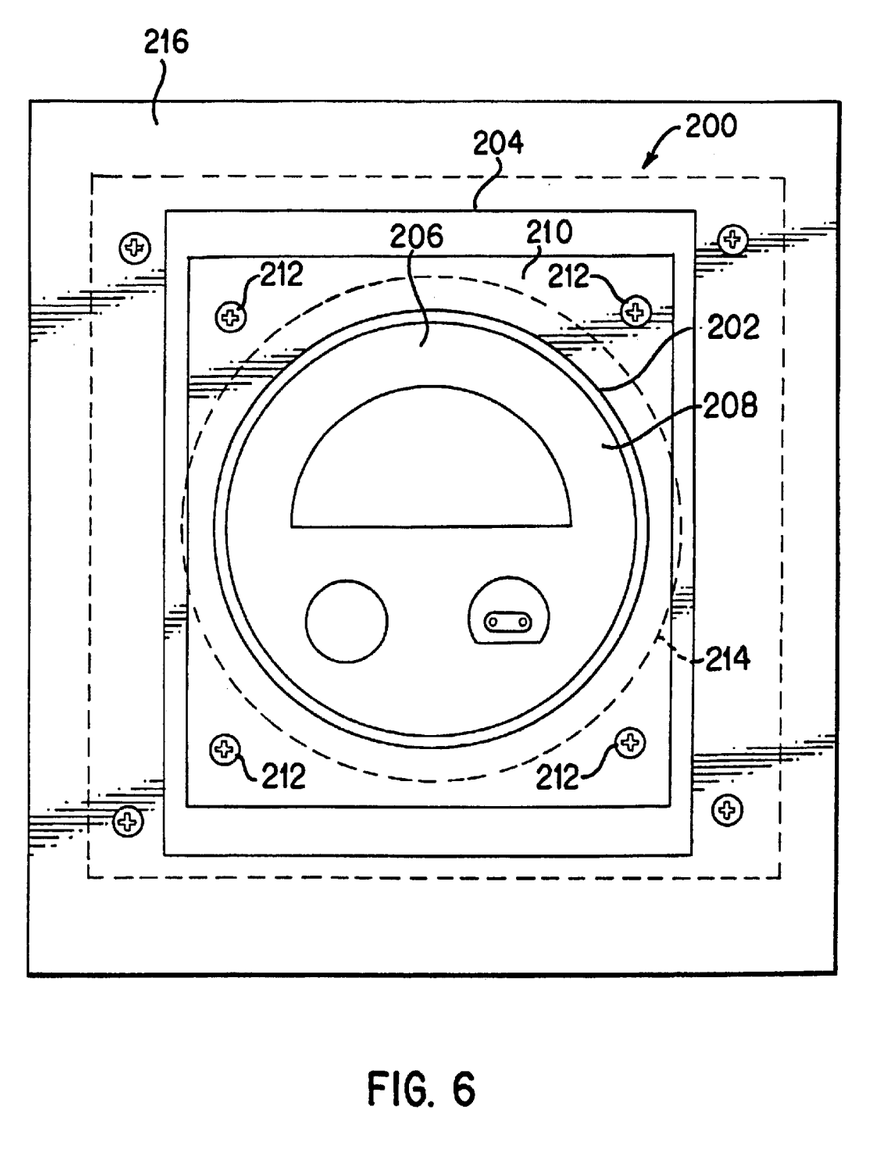
FIG. 6 illustrates a front view of a third embodiment of the present invention which allows a socket meter to be mounted from the front of the panel, but which does not expose a large opening when the meter has been installed.

Referring to FIG. 6, an adapter 200 of yet another alternative embodiment of the of the present invention is shown. In the adapter 200, the opening 202 in the front wall 204 of the adapter 200 is substantially the same diameter as the face 206 meter 208. However, in the adapter 200, the front wall 204 includes a removable face plate 210, which is shown as being attached to the front wall 204 by a screws 212. Beneath the removable face plate 210 there is another, larger opening 214 (shown in shadow). While the opening 214 is shown as being round, it can be rectangular or other suitable shape without departing from the concept disclosed with respect to this embodiment 200 of the invention, which is that the removable face plate 210, can be removed from the front wall 204 of the adapter 200, by removing the screws 212. With the face plate 210 removed, the larger opening 214 is exposed, and the meter 208 can be installed, removed, or replaced from the front of the switchboard 216 as could be done with the embodiment 100 of the adapter, as shown in FIG. 4.

Another modification shown in the embodiment 200, but which could be used in any of the embodiments of the adapter is the absence of the hook 38 shown in FIGS. 2 and 3.

Figure 5:
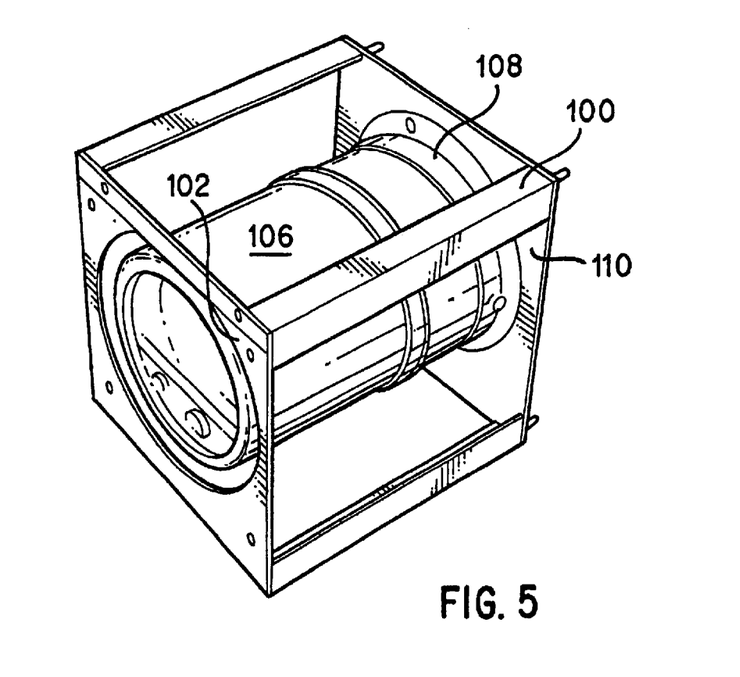
FIG. 5 illustrates a perspective view of the embodiment of FIG. 4 showing how a socket meter appears when mounted in that embodiment of the invention.
Figure 7:
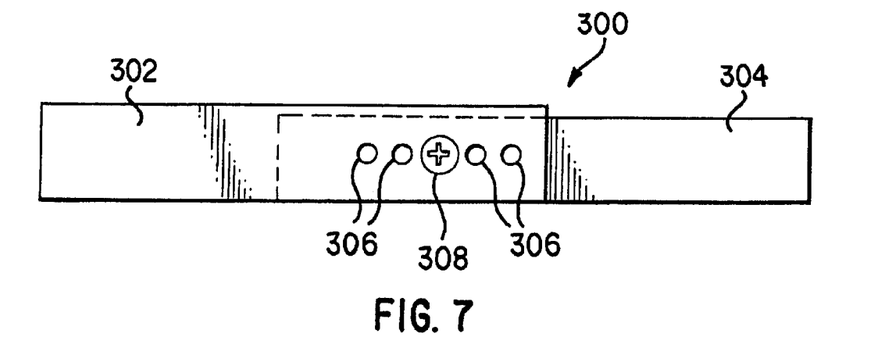
FIG. 7 illustrates a side view of a first embodiment of an adjustable leg design for the adapter of the present invention.
Figure 8:
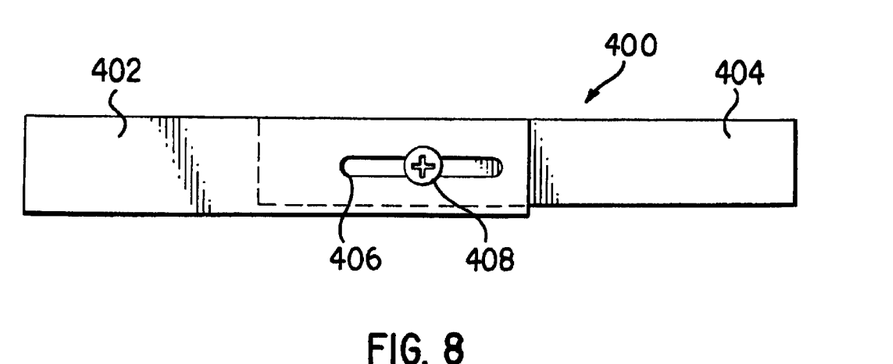
FIG. 8 illustrates a side view of a second embodiment of an adjustable leg design for the adapter of the present invention.

Referring now to FIGS. 7 and 8, still other variations on the present invention are shown. In particular, while the embodiment 10 shown in FIGS. 1, 2, and 5, was shown as having legs which had a fixed length, there are meters which have different lengths. Accordingly, in order to provide an adapter which can be used with various meters, it is necessary to manufacture different adapters which have legs having different fixed lengths. In order to minimize costs while retaining manufacturing flexibility, it may be desirable to provide adapters having legs whose lengths can be varied. This can be accomplished by providing adapters with an adjustable leg configuration, as shown in FIGS. 7 and 8.

In FIG. 7, the adjustable leg 300 is comprised of a first leg portion 302 and a second leg portion 304. The first leg portion 302 includes a series of fixed openings 306 which are spaced from one another, while the second leg 304 portion includes at least one tapped opening which can be used to receive a screw 308. Alternatively, there can be one or more openings in the first leg portion 302, and the second leg portion can include a number of tapped openings. In either case, by selecting a suitable opening 306 in the first leg portion, and matching it with a suitable tapped opening in the second leg portion 304, the overall length of the leg 300 can be readily adjusted.

Similarly, with reference to FIG. 8, an adjustable leg 400 is comprised of a first leg portion 402 and a second leg portion 404. The first leg portion 402 includes an elongated opening 406, while the second leg portion 404 includes a tapped opening which can be used to receive a screw 408. The overall length of the leg 400 can be adjusted by sliding the leg portions 402, 404, and then tightening the screw 408 when a suitable length has been achieved.

Figure 9:
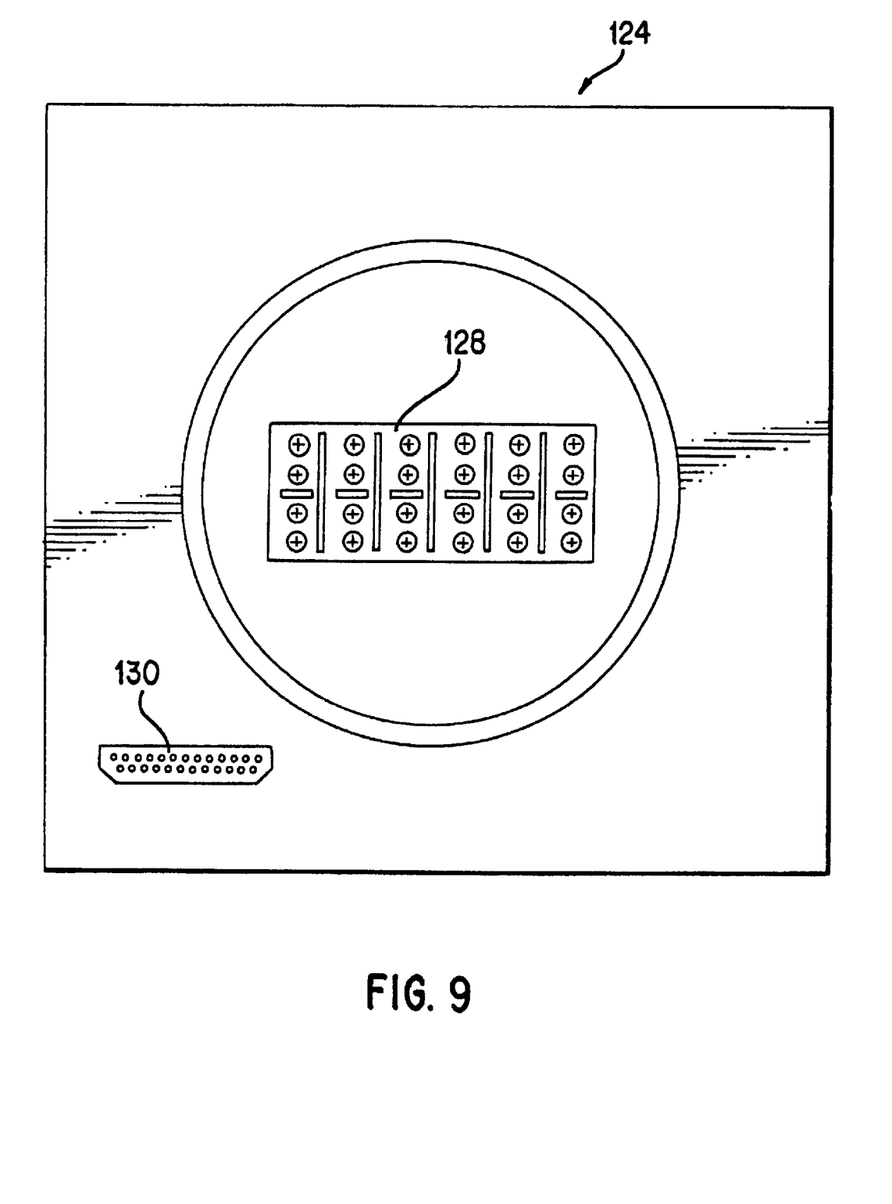
FIG. 9 is a rear view of the rear wall of an alternative embodiment of the adapter of the present invention.

As described above with reference to FIG. 1, the rear wall 24 of the adapter 10 has a meter socket 26 mounted to it. The meter socket 26 includes a connection portion 30 to which electrical connections to the meter 12 are made when the meter 12 is in the adapter 10. An input/output cable 36 connected to the meter 12 is shown as being separate from the rear wall 24. As it may be desirable to avoid having a loose cable, FIG. 9 illustrates an alternative rear wall 124 which includes the standard connectors 128, but which also includes a panel mounted input/output connector 130 which is mounted to the rear wall 124 in order to avoid the loose cable. Instead, the front portion of the rear wall 124 includes a connector (not shown) to which the input/output cable 36 is connected, and the panel mounted input/output connector 130 provides data accessibility, without the need for a loose cable as in FIG. 1.

Figure 10:
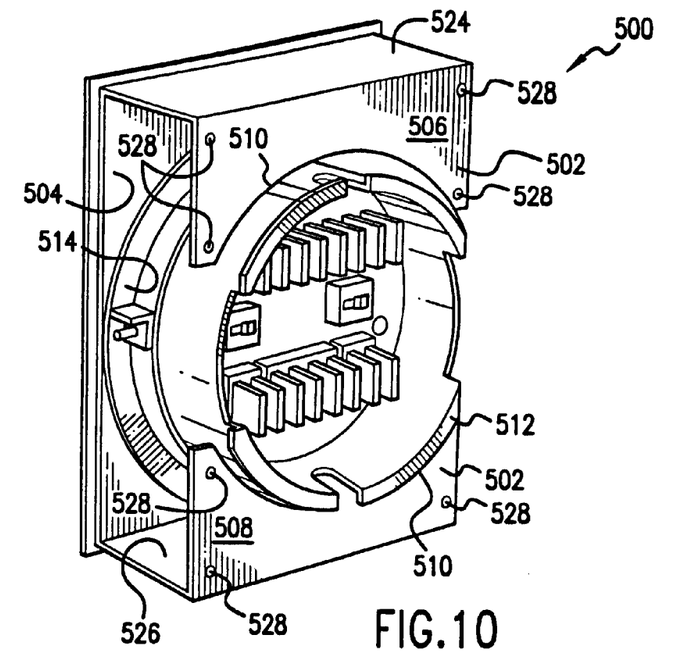
FIG. 10 is a front perspective view of a surface mount panel adapter in accordance with the present invention.
Figure 11:
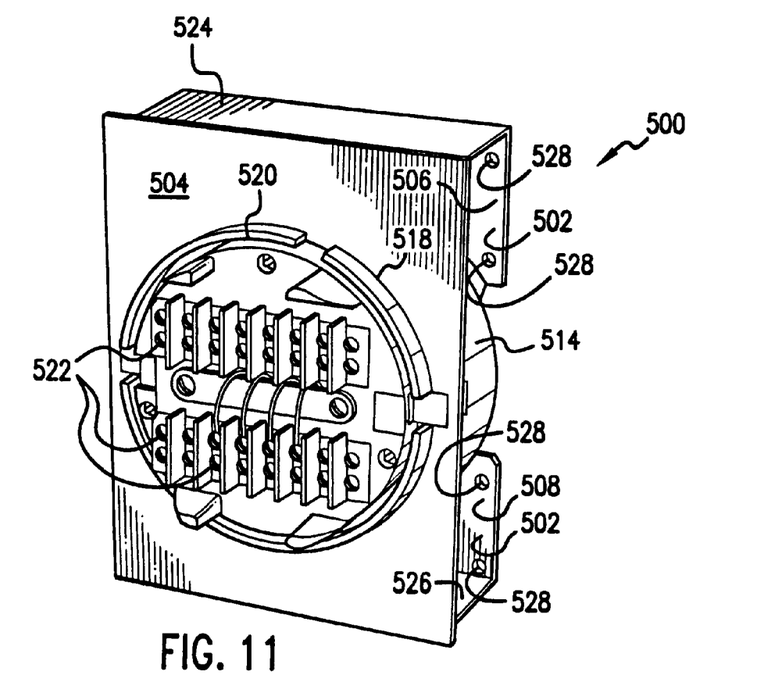
FIG. 11 is a rear perspective view of the surface mount panel adapter of FIG. 10.
Figure 12:
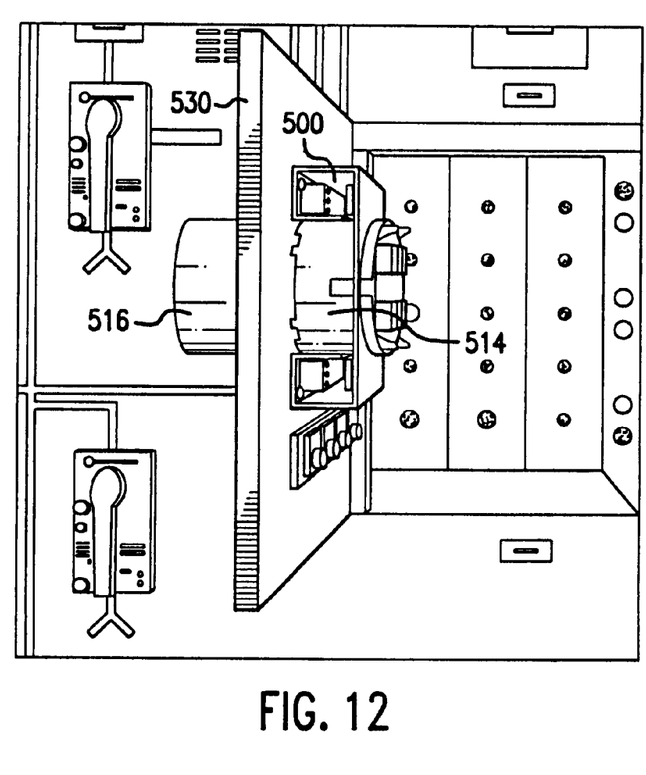
FIG. 12 is a perspective view of the surface mount panel adapter of FIG. 10, as installed on a switchboard.

Referring now to FIGS. 10–12, another embodiment of the present invention, in the form of a surface mount panel adapter 500, is shown. As shown, the surface mount panel adapter 500 includes a front wall 502 and a rear wall 504. As illustrated, the front wall 502 in the preferred embodiment 500 has an upper portion 506 and a lower portion 508, with the two portions 506, 508 being separated by an opening 510 formed therethrough (See FIG. 10). In the surface mount panel adapter 500 of the preferred embodiment, the opening 510 has a size and configuration which is slightly larger than the size of the front 512 of a meter socket 514 mounted in the panel adapter 500, which meter socket 514 is intended to be used to mount a socket meter 516 (See FIG. 12) which is intended to be mounted in the panel adapter 500.

With continued reference to FIGS. 10–12, the front wall 502 of the preferred embodiment of the surface mount panel adapter 500 includes an opening 518 having a size and configuration which is adapted to expose the rear portion 520 of the meter socket 514 which is mounted therein. As shown in FIG. 11, the rear portion of the meter socket 520 typically includes a number of terminal blocks 522 which are used to make connections to the meter socket 514 (and, ultimately, to a meter installed therein).

As illustrated, the preferred embodiment of the surface mount panel adapter 500 is formed of a single piece of metal. Accordingly, the upper portion 506 of the front wall 502 is connected to, and spaced from, the rear wall 504 by an upper leg 524. Similarly, the lower portion 508 of the front wall 502 is connected to, and spaced from, the rear wall 504 by a lower leg 526. As the purpose of the legs 524, 526 is to provide spacing between the front wall 502 and the rear wall 504 it is not necessary for the legs 524, 526 to be solid sheets, as shown. Alternatively, these legs could be in the form of individual legs (See legs 18, 20, 22 in FIG. 1). They could also be made adjustable, as illustrated in FIGS. 7 and 8.

The surface mount panel adapter includes means, such as the tapped openings 528, which may be used, together with screws, for mounting the surface mount panel adapter 500 to a switchboard panel 530 (See, FIG. 12).

In use, the surface mount panel adapter 500 includes a meter socket 514 mounted in it, and it is mounted to a switchboard, as shown in FIG. 12. This exposes the front 512 of the meter socket 514 through the front of the switchboard panel, so that a socket meter 516 can simply be plugged into the meter socket 514. The terminal blocks 522 on the rear portion 520 of the meter socket 514 are used to make electrical connections to the meter socket 514.

While the preferred embodiment of the surface mount panel adapter 500 is constructed of a single piece of metal which has been folded to form the front and rear walls 502, 504, and the spacing upper and lower legs 524, 526, it is possible to form the device in separate parts, to mold it from a plastic material, or otherwise form it, so long as it maintains the relationships set forth herein so that it can be used to mount a meter socket. Thus, while the front wall 502 is formed in two portions, with the "opening" 510 formed therebetween, the specific format used in the preferred embodiment could be modified without departing from the inventive concept described. For example, if the front wall was formed of a single piece of material, the opening formed therein would be circular in shape. In such case, the rear wall could be discontinuous, or the legs could be removable or adjustable, to allow the mounting of the meter socket.

As will be obvious to those skilled in the art, the use of the surface mount panel adapter 500 in connection with a switchboard 530 provides a unique way to retrofit the switchboard 530 such that a meter 516 is mounted on the front surface of the switchboard 530, rather than in the rear of the switchboard 530.

Figure 13:
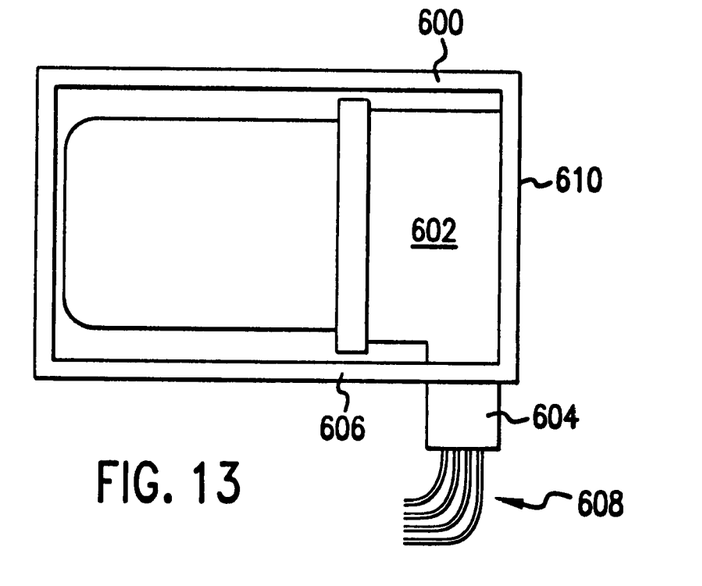
FIG. 13 is a side view of the embodiment of FIGS. 1–8 illustrating a meter socket which does not use terminal blocks mounted on its rear surface.

While a number of designs for the present invention have been disclosed, those skilled in the art will recognize that other design differences may be utilized without departing from the scope of the present invention. Thus, while meter sockets have been shown in which the terminal blocks extend out of the rear of the meter socket, thereby requiring an opening in the rear wall of the panel adapter, other types of meter sockets exist, and are well known to those skilled in the metering arts in which the terminal blocks are formed in the bottom of the meter socket. Thus, with reference to FIG. 13, a panel adapter 600, having a meter socket 602 mounted thereon, is shown. The meter socket 602 includes a portion 604 containing the socket's terminal blocks which extends downward beneath the leg 606, so that the wires 608 connecting the socket 602 to the terminal blocks do not extend through the rear wall 610 of the panel adapter 600.

Figure 14:
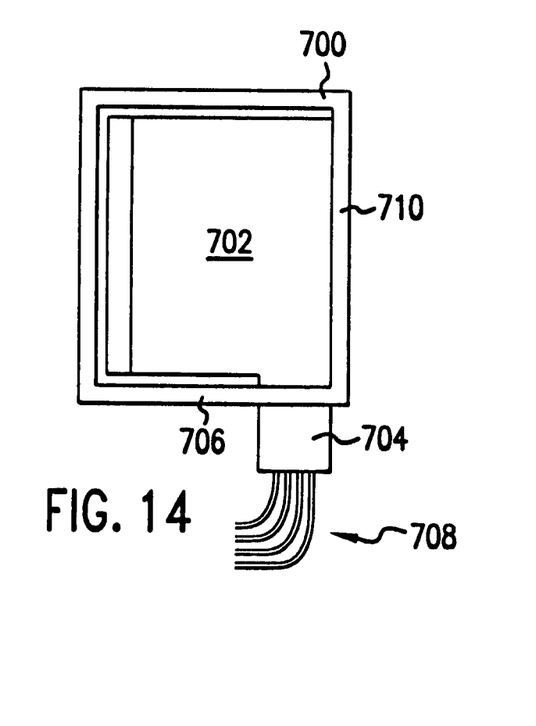
FIG. 14 is a side view of the embodiment of FIGS. 10–12 illustrating a meter socket which does not use terminal blocks mounted on its rear surface.

Similarly, a surface mount panel adapter 700 is shown in FIG. 14, in which a meter socket 702 is mounted thereon. The meter socket 702 includes a portion 704 containing the socket's terminal blocks which extends downward beneath the leg 706, so that the wires 708 connecting the socket 702 to the terminal blocks do not extend through the rear wall 710 of the panel adapter 700.

Figure 15:
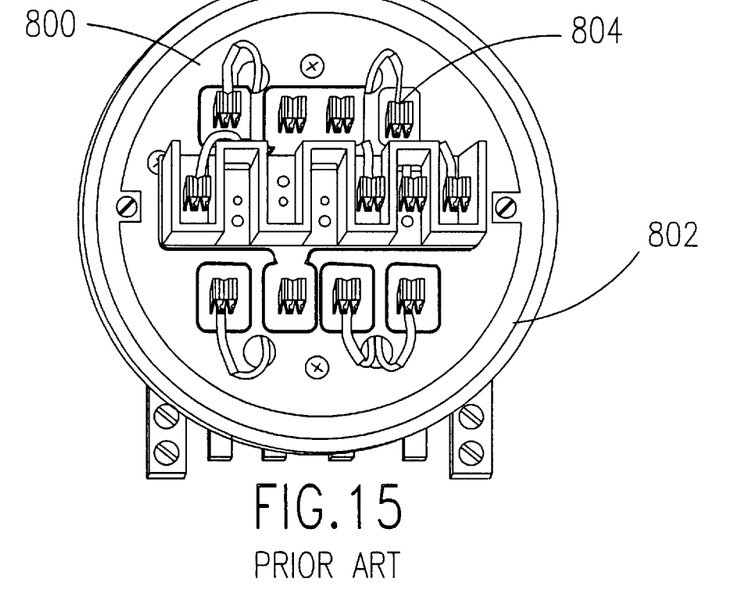
FIG. 15 is a top perspective view of a prior art assembly which includes a meter socket and a mounting ring.
Figure 16:
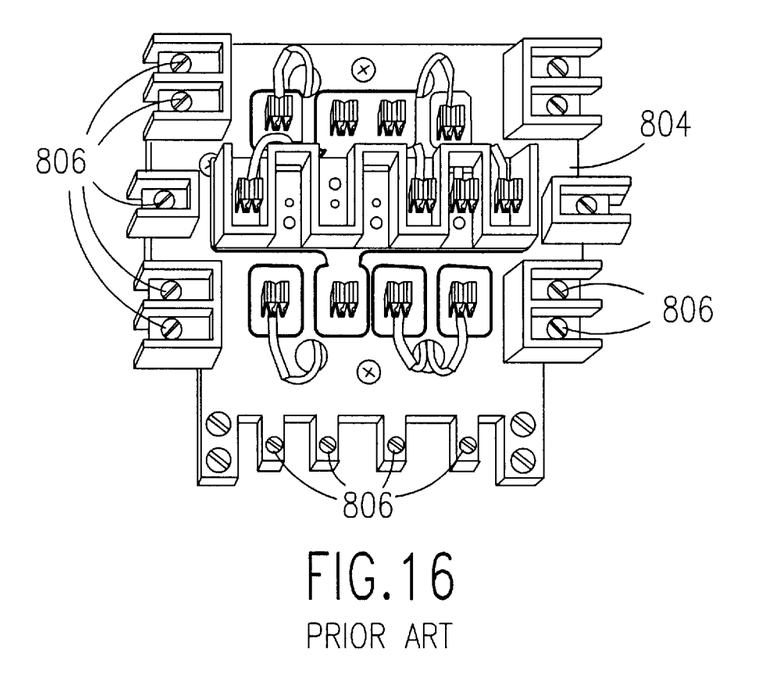
FIG. 16 is a top perspective view of the prior art assembly of FIG. 15 with the mounting ring removed.

Referring now to FIGS. 15–16, a so-called Ring and Block Assembly for Panelboard Metering, sold by Meter Devices Company ("MDC") of Canton, Ohio as their 5790 Series, is shown. The unit 800 includes an aluminum ring 802, which can be used for mounting the unit 800 to an opening formed in a switchboard panel. The aluminum ring 802 surrounds a phenolic terminal block 804, to which a socket meter can be mounted. The way the unit 800 is constructed shows it to have been intended for front mounting applications, in that it includes a number of connecting screws 806 (See, FIG. 16, in which the ring 802 is removed) which are exposed to the meter side of the block 804. The connection screws 806, which are used to connect wires to the block 804, may be seen when the ring 802 is removed, as shown in FIG. 16.

To the extent that one would want to use the MDC 5790 to permit the mounting of a socket meter on a switchboard, it would be quite difficult to do so, given its design, due to the locations and orientation of the connection screws 806, as well as the requirement that the ring 802 be removed to gain access to them. In particular, with the unit 800 facing out of a switchboard panel, access to the connection screws 806 would not be possible to by an installer on the service (rear) side of the switchboard panel. Accordingly, installing the MDC 5790 would require multiple installers, thereby increasing the cost of an installation. Further, should a connection be loose, or should one get loose, merely tightening a connection screw 806, would not be a trivial task.

Figure 17:
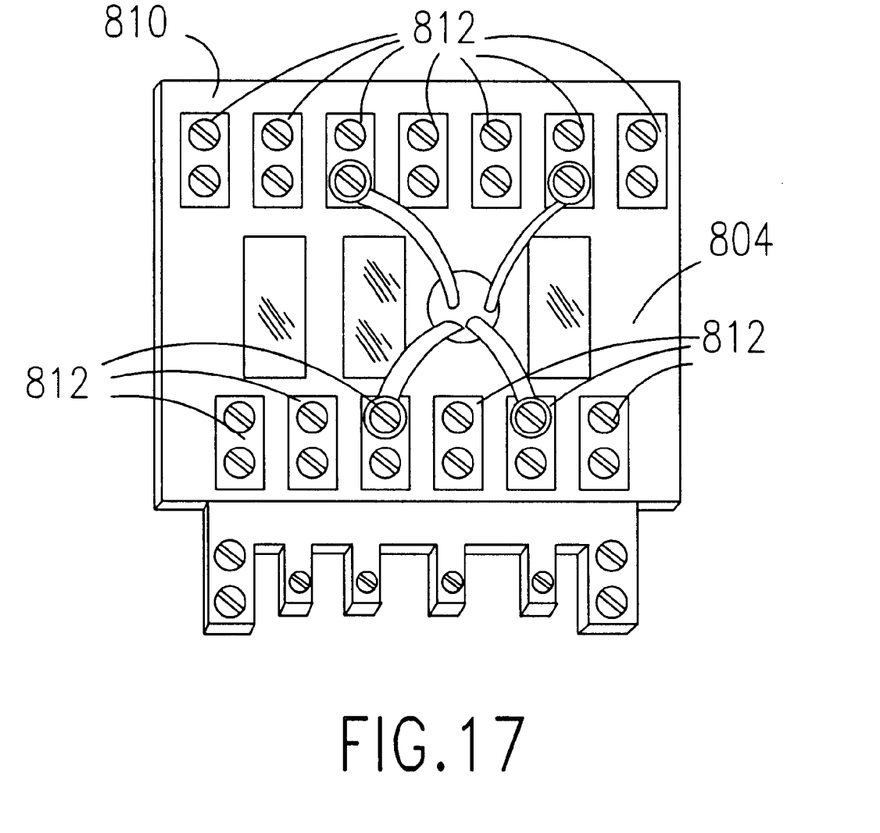
FIG. 17 is a bottom perspective view of an alternative embodiment of the present invention in which the prior art assembly of FIGS. 15 and 16 has been modified in accordance with the present invention.
Figure 18:
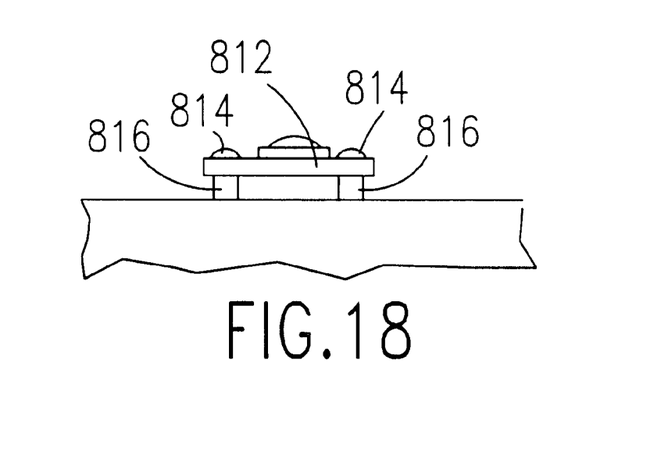
FIG. 18 is a side view showing standoffs used to separate the terminal strips from the block.

As shown in FIG. 17, in accordance with another embodiment 810 of the present invention, a modification is made to an MDC 5790 in which terminal strips 812 are attached to the rear surface of the block 804. The terminal strips 812 are wired to the connection screws 806, so that all further connections to the unit 810 can be made solely to the terminal strips 812. After the terminal strips 812 have been so wired, and the mounting ring 802 has been reinstalled, it becomes a simple matter for a single installer to wire the unit 810 to the service, as all of the electrical contacts which require connection are exposed at the rear of the unit 810. As will be obvious to those skilled in the art, the terminal strips 812 can be mechanically attached to the rear of the block 804 by any means which provides adequate mechanical security, while also providing electrical isolation between the various conductive portions of the strips 810 and the block 804. Thus, as shown in FIG. 18, machine screws 814 and standoffs 816, or other suitable spacers could be used, and those skilled in the art will recognize that so long as the terminal strips 812 are mechanically attached, and electrically isolated, the unit 810 will fall within the spirit and scope of the present invention. Alternatively, the terminal block 804 can be molded so as to include the terminal strips 812 as a part thereof.

I claim:

1. A surface mounted panel adapter for use with a socket mounted electricity meter, comprising:

(a) a terminal block including a meter socket to which a socket meter can be attached;

(b) means for attaching the adapter to a switchboard panel, said means for attaching including means for affixing said means for attaching to said terminal block; and (c) said adapter having a front wall and a rear wall, said meter socket being affixed to said adapter and exposed through said front wall, and electrical connection means mounted on said rear wall of said adapter, said electrical connection means including said terminal block and including electrical connections to said meter socket and being configured and oriented such that they will be individually accessible to an installer on the rear side of the switchboard panel, said electrical connection means being electrically connected to said meter socket on said terminal block, whereby a socket mounted meter which can be mounted in said meter socket attached to said adapter will extend out from said switchboard when mounted in said meter socket.

2. The surface mounted panel adapter of claim 1 wherein said electrical connection means comprises at least one terminal strip.

3. The surface mounted panel adapter of claim 2 wherein said at least one terminal strip includes screws for making electric connections thereto, said screws being exposed to the rear of said adapter, whereby an installer will have ready access to said at least one terminal strip when said adapter is installed in a switchboard panel and said installer is on the rear side of said switchboard panel.

4. The surface mounted panel adapter of claim 3 wherein said at least one terminal strip is mechanically affixed to said terminal block.

5. The surface mounted panel adapter of claim 4 wherein said at least one terminal strip is mounted to said terminal block using standoffs.

6. The surface mounted panel adapter of claim 1 wherein said means for attaching is comprised of a ring which encircles, and attaches to, said terminal block.

\* \* \* \* \*